(12) United States Patent
Aldrich

(10) Patent No.: US 6,170,316 B1
(45) Date of Patent: *Jan. 9, 2001

(54) PRESSURE AND VACUUM SWITCH TESTING TOOL

(75) Inventor: Jack Aldrich, Anaheim, CA (US)

(73) Assignee: Clinton L. Aldrich, North White Plains, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/295,092

(22) Filed: Apr. 21, 1999

(51) Int. Cl.[7] .................................................. G01L 27/00
(52) U.S. Cl. .............................................. 73/1.58; 73/1.68
(58) Field of Search .................................. 73/1.57, 1.58, 73/1.68, 1.71

(56) References Cited

U.S. PATENT DOCUMENTS

| | | | |
|---|---|---|---|
| 2,490,821 | * 12/1949 | Leonard | 73/1.71 |
| 3,720,090 | * 3/1973 | Halpert et al. | 73/1.71 |
| 3,831,391 | * 8/1974 | Blomstrand | 73/1.71 |
| 3,927,553 | * 12/1975 | Frantz | 73/1.71 |
| 4,658,829 | * 4/1987 | Wallace | 73/1.58 |
| 4,664,635 | * 5/1987 | Hermann | 73/1.68 |

* cited by examiner

Primary Examiner—Robert Raevis
(74) Attorney, Agent, or Firm—Hunton & Williams

(57) ABSTRACT

A tool for testing pressure/vacuum engine control switches includes a first and second housing. The housings each include inner and outer passages. The housings are attached with the inner passages placed adjacent each other. When attached, the housings form a continuous longitudinal passage. A pressure chamber is attached to the first housing and includes a valve. The valve provides a passage to a testing chamber. The testing chamber includes a receptacle, pressure/vacuum gauge, and a plug. The first housing also includes a vent and a piston/rod arrangement which define a fluid chamber in the first housing. The rod extends from the first housing through the inner passages and partially into the second housing. A seal is provided around the portion of the rod which passes through inner passages. A return spring is provided around the portion of the rod which extends into the second housing. A lock-and-swivel joint is located at the end of the portion of the rod extending into the second housing. A threaded rod is attached to the lock-and-swivel joint and extends through the outer passage of the second housing. An adjusting knob is provided at the end of the threaded rod outside of the second housing. Preferably, the second housing also includes a mechanism for mounting a battery. The mechanism may include two (or more) mounting plates extending perpendicular to the second housing such that a battery may be inserted and retained therebetween. Wires may be attached to respective mounting plates and be provided with clips at the ends thereof. A light bulb may be provided on one wire.

11 Claims, 1 Drawing Sheet

PRESSURE AND VACUUM SWITCH TESTING TOOL

FIELD OF THE INVENTION

The invention relates to a tool for testing pressure and vacuum switches. More particularly, the invention relates to a tool for measuring the pressure or vacuum at which an engine control switch "makes or breaks" contact.

BACKGROUND OF THE INVENTION

Engine control switches are used in air compressors, auxiliary generators, water pumps, marine engines, and various other devices. The switches are set to "make or break" an electrical contact at a predetermined pressure or vacuum within the switch. Typically, to test the pressure or vacuum at which these switches "make or break" contact, the switches must be installed in automobiles or other mechanically operated equipment. That causes problems because it is difficult and time consuming to install control switches in engines, compressors, pumps, automobiles, etc. Therefore, if a defective or improperly set engine control switch is installed in an automobile or other engine driven unit, the switch may not be determined to be defective or improperly set until after the switch is already installed. Thus, the switch must be removed, adjusted or replaced, and then reinstalled. This may need to be repeated several times before the switch is properly set or replaced to correct pressure or vacuum setting problems. This consumes valuable time and resources which would not need to be expended if a switch could be tested prior to installation.

These and other problems exist.

SUMMARY OF THE INVENTION

An object of the present invention is to overcome these and other drawbacks in existing systems.

Another object of the present invention is to provide a single tool for testing engine control switches prior to installation.

Another object of the present invention is to provide a tool for determining the pressure or vacuum at which an engine control switch "makes or breaks" contact.

Another object of the present invention is to provide a tool that provides a visual indication of when a switch "makes or breaks" contact.

Another object of the present invention is to provide a tool for testing engine control switches which sets the "make or break" pressure of an engine control switch.

These and other objects of the invention are achieved according to various embodiments of the invention. According to one embodiment, a tool for testing engine control switches uses fluid pressure or a vacuum for determining the pressure or vacuum at which an engine control switch "makes or breaks" contact. The tool uses a rod and piston arrangement to apply a pressure or vacuum to the switch being tested. The piston and a portion of the rod are housed within a first housing (along with a fluid chamber comprising a fluid) and the remaining portion of the rod (surrounded by a return spring), a lock-and-swivel joint, and a portion of a threaded rod are housed within a second housing. The threaded rod extends through the second housing and exits through an outer passage at a side opposite the first housing. An adjusting knob is disposed at the exterior end of the threaded rod.

The first housing has a pressure chamber connected to the fluid chamber side and comprises a valve. The pressure chamber is also attached to a testing chamber having a receptacle for receiving a standard hollow threaded screw provided on an engine control switch and has a pressure/vacuum gauge attached thereto. The receptacle may be provided with a plug to prevent leakage of fluid from the fluid chamber.

The second housing may also be provided with mounting plates extending from the second housing. The mounting plates may be used for securing a battery to the second housing and have wires attached thereto. The ends of the wires are provided with clips for attaching to terminals of a switch. Preferably, one of the wires comprises a light bulb for providing a visual indication of when the switch "makes or breaks" contact.

According to one embodiment, the tool may be used to measure the pressure at which an engine control switch "makes or breaks" contact. In this embodiment, the plug is removed from the receptacle and the standard hollow threaded screw provided on the switch is inserted into the receptacle. The clips on the wires are attached to the terminals of the switch and the valve is opened by rotating the adjusting knob in a direction which increases the pressure within the pressure chamber (e.g, clockwise). The adjusting knob is rotated until the light bulb illuminates. When the light bulb illuminates, this indicates that contact has been made within the switch. A reading of the pressure/vacuum gauge identifies the pressure at which the switch makes contact.

According to another embodiment, the tool may be used to test vacuum switches. In this embodiment, the valve is opened by rotating the adjusting knob in a direction which increases pressure in the pressure chamber and expels fluid therefrom (e.g., clockwise). The switch is inserted into the receptacle and the clips are attached to the terminals of the switch. The adjusting knob is then rotated in the opposite direction to create a vacuum (e.g., counter clockwise). The adjusting knob is rotated until the light bulb either illuminates or extinguishes (depending on whether the switch is a "make" or "break" switch). When the light bulb changes operation (i.e., on or off), this indicates that the vacuum point at which the switch "makes or breaks" contact has been achieved. A reading of the pressure/vacuum reveals the vacuum reading for this point.

These and other objects, features, and advantages of the invention will be readily apparent to those having ordinary skill in the pertinent art from the detailed description of the preferred embodiments with reference to the appropriate figures.

BRIEF DESCRIPTION OF THE DRAWING

The FIGURE is a cross-sectional view of a switch testing tool in accordance with one embodiment of the invention.

DETAILED DESCRIPTION OF THE PREFERRED EMBODIMENTS

Figure 1:
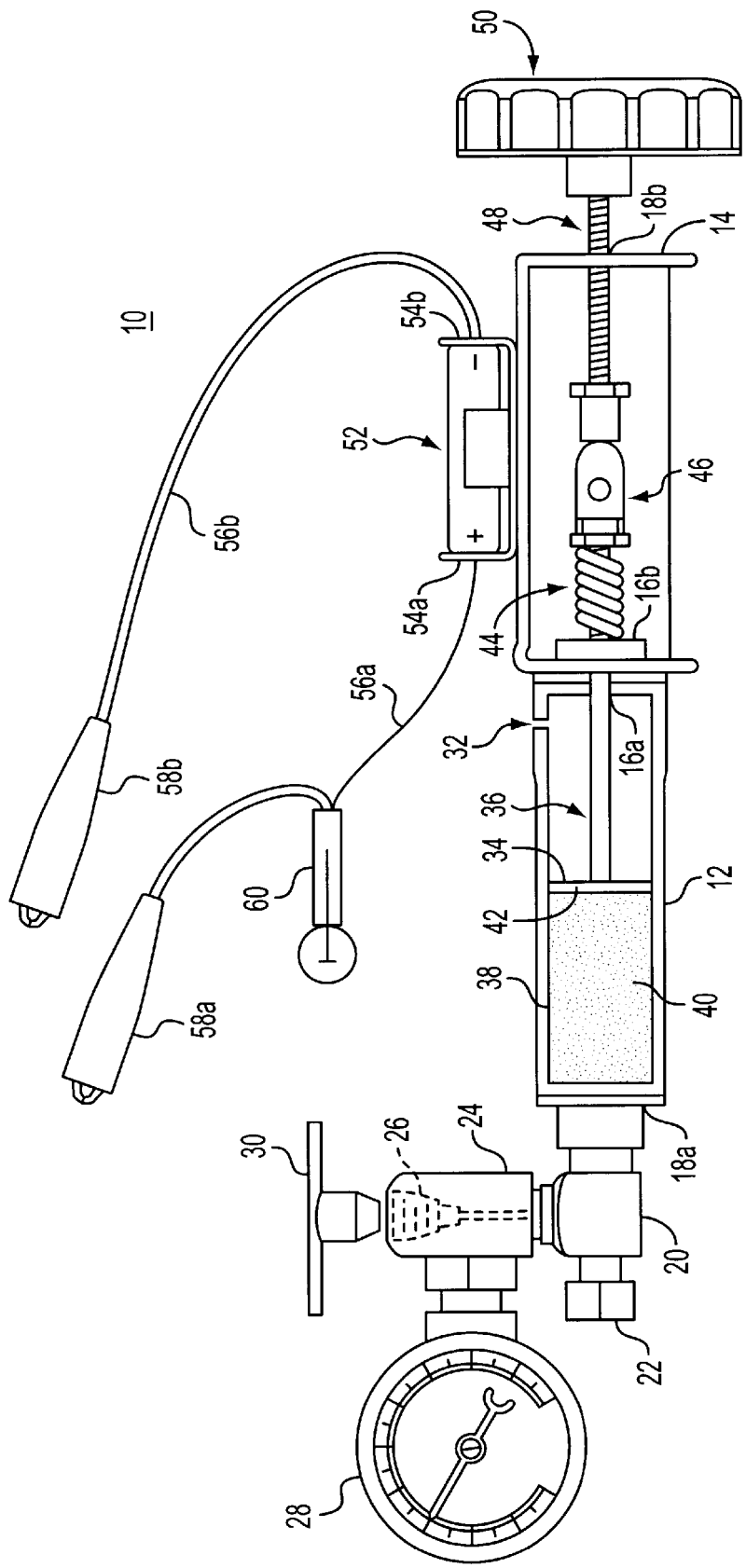

According to one embodiment of the invention, a tool 10 includes a first housing 12 and a second housing 14. First housing 12 and second housing 14 each comprise inner passages 16a, 16b and outer passages 18a, 18b, respectively. First housing 12 and second housing 14 are connected so that inner passages 16a, 16b allow rod 36 to pass therethrough. Any known suitable mode of attaching first housing 12 and second housing 14 may be used (e.g., molding, die casting, screw and threaded receptacle, welding, nut and bolt fastener, etc.). When attached, first housing 12 and second housing 14 form a continuous longitudinal passage via inner passages 16a, 16b. Inner passages 16a, 16b may be threaded.

A pressure chamber 20 may be connected to first housing 12 and include a valve 22. Pressure chamber 20 may be attached using any known modes of attachment. Valve 22 controls fluid communication between pressure chamber 20 and a testing chamber 24. Testing chamber 24 may comprise a pressure/vacuum gauge 28 and a receptacle 26 to receive a switch to be tested. A plug 30 may be provided to be secured to receptacle 26. Testing chamber 24 may also be connected to pressure chamber 20 using any type of known attaching mode such as welding, die casting and the like.

First housing 12 comprises a vent 32 and encloses a piston 34 and a portion of a rod 36. Piston 34 and first housing 12 define a fluid chamber 38 which houses a fluid 40 (e.g., a lubricating oil). Piston 34 is preferably a "push-pull" type piston allowing tool 10 to be used for measuring both pressure and vacuum, although other types of pistons may also be used. Rod 36 extends from first housing 12, through inner passages 16a, 16b, and partially into second housing 14.

A return spring 44 may be provided around the portion of rod 36 extending into second housing 14. A lock-and-swivel joint 46 may be provided at the end of rod 36 extending into second housing 14. A threaded rod 48 may be connected to lock-and-swivel joint 46 and extends through outer passage 16b of second housing 14. Threaded rod 48 and rod 36 may comprise a single continuous rod. An adjusting knob 50 is provided at the end of threaded rod 48 outside of second housing 14.

Preferably, second housing 14 also includes a mechanism for mounting a direct current ("DC") power supply 52 (e.g., two "AA" batteries). The mechanism may comprise two (or more) mounting plates 54a, 54b extending from second housing 14 such that a battery may be inserted and retained therebetween. Wires 56a, 56b may be attached to respective mounting plates 54a, 54b and be provided with respective clips 58a, 58b (e.g., alligator clips) at the ends thereof. A light-emitting device (e.g, a four (4) volt light bulb) 60 may be provided on one wire. Preferably, light 60 is provided on the wire which is attached to the mounting plate contacting a positive terminal of the battery.

Tool 10 may be used for determining the pressure at which an engine control switch makes contact. In operation, a battery 50 is mounted between mounting plates 52a, 52b and an engine control switch to be tested (not shown) having a standard hollow threaded attachment screw is screwed into receptacle 26. If tool 10 includes plug 30, plug 30 is removed prior to inserting the switch. Clips 58a, 58b are attached to terminals of the switch and adjusting knob 50 is rotated to increase the pressure in pressure chamber 20 (e.g., clockwise) by causing piston 34 to move within first chamber 12 to reduce the volume in the area formed by fluid chamber 38 and pressure chamber 20. Upon rotating adjusting knob 50, valve 22 is opened. Fluid 40 thereby flows through pressure chamber 20 and testing chamber 24 and into the switch. Adjusting knob 50 may be rotated until light 60 illuminates. When light 60 illuminates, contact has been made within the engine control switch. The pressure that causes the engine control switch to make contact may then be determined using pressure/vacuum gauge 28.

During operation, rotation of adjusting knob 50 to increase the pressure within pressure chamber 20 forces lock-and-swivel joint 46 to push rod 36 into first housing 12. This in turn, pushes piston 34, increase the pressure in fluid chamber 38, opens valve 22, and forces fluid 40 into pressure chamber 20, testing chamber 24, and ultimately, into the engine control switch. Vent 32 allows piston 34 to slide longitudinally within first housing 12 by providing the transfer of air from outside of first housing 12 to inside of housing 12, and vice versa. Seal 42 prevents lateral movement of rod 36 within inner passages 16a, 16b to facilitate operation of tool 10.

As adjusting knob 50 is rotated, fluid 40 acculates within the switch until a sufficient amount of pressure accrues within the switch to "make or break" contact. After a sufficient amount of pressure is acquired and contact within the switch has been established, light 60 illuminates. A user of tool 10 may then determine the amount of pressure required to "make or break" contact by reading pressure/vacuum gauge 28.

Return spring 44 may be used to facilitate counter-rotation (e.g., counter clockwise) of adjusting knob 50. Return spring 44 provides a force opposite to a force exerted on return spring 44 when adjusting knob is rotated in a designated direction (e.g., clockwise). Therefore, when adjusting knob 50 is rotated to create a vacuum, return spring 44 assists the counter-rotation adjusting knob 50.

After the switch has been tested and removed from receptacle 26, plug 30 may be inserted into receptacle 30 to prevent loss of fluid 40. Furthermore, fluid 40 may be added to fluid chamber 38 by inserting fluid through receptacle 26.

Tool 10 may also be used to measure the vacuum at which an engine control switch "makes or breaks" contact. For example, adjusting knob 50 may be rotated in a direction which increases the pressure within pressure chamber 20 to thereby expel fluid 40 from pressure chamber 20 (e.g., clocks. The switch is inserted into receptacle 26 (provided plug 30 has been remove using the standard hollow threaded screw provided on the switch. Clips 58a, 8b are then attached to the terminals of the switch. Adjusting knob 50 is rotated in the direction opposite to the initial rotation (e.g., counter clockwise) until light 60 illuminates or extinguishes (depending on whether the switch is a "make" or "break" vacuum switch). A reading of pressure/vacuum gauge 28 indicates the vacuum at which the switch "makes or breaks" contact.

Tool 10 may also be used to set the pressure at which an engine control switch "makes or breaks" contact. For example, to set the "make or break" contact pressure, plug 30 is inserted into receptacle 26. Adjusting knob 50 is rotated in a direction which increases the pressure within pressure chamber 20 (e.g., clockwise). Adjusting knob 50 is rotated until pressure/vacuum gauge 28 reads the pressure desired to be set for a switch. After reaching the desired pressure, valve 22 is closed (e.g., by rotating the valve using a screw driver or other conventional apparatus). Tool 10 is now set to the desired pressure.

After setting tool 10 to the desired pressure, plug 30 is removed and the switch is inserted in receptacle 26. Clips 58a, 58b are then attached to the terminals of the switch. Valve 22 is opened and a reading of pressure/vacuum gauge 28 identifies the pressure within the switch. If the pressure reading indicates a pressure higher or lower than the desired pressure, the switch may be adjusted to achieve the desired pressure. Light 60 may be used to provide a visual indication of the pressure at which the switch "makes or breaks" contact.

Other embodiments and uses of the invention will be apparent to those skilled in the art from consideration of the specification and practice of the invention disclosed herein. The specification and examples should be considered exemplary only. The scope of the invention is only limited by the claims appended hereto.

What is claimed is:

1. A hand-held tool for testing both pressure and vacuum switches to determine the pressure at which the pressure switch operates and the vacuum at which the vacuum switch operates comprising:

receptacle means for receiving either a pressure or vacuum switch;

pressure chamber means connecting the receptacle means to a fluid housing means through a valve means;

a valve means connecting the pressure chamber means to the fluid housing means;

wherein the fluid housing means stores a fluid that may be supplied to a pressure switch through the receptacle means when the valve means is opened between the first fluid housing means and the pressure chamber means;

an adjustment housing chamber connected to the fluid housing means with a first passageway between the adjustment housing chamber and the fluid housing means to allow a rod of an adjustment means to pass between the adjustment housing chamber and the fluid housing means and a second passageway that allows the rod to pass out of the adjustment housing chamber to a knob that allows the adjustment means to function;

adjustment means for adjusting the pressure in the pressure chamber to thereby adjust the pressure applied to the pressure switch or the vacuum drawn on the vacuum switch, the adjustment means comprising the rod that passes from the adjustment housing chamber through the passageway and into the fluid housing means to a piston disposed within the fluid housing means;

a return spring applying pressure against the rod and adjustment housing to resist pressure application to enable the user applying pressure to modify the pressure more regularly;

a vent in the fluid housing means to allow air to assist in application of pressure against the fluid in the fluid housing means;

wherein the adjustment means applies pressure to a pressure switch in the receptacle means by forcing the fluid from the fluid housing means through the valve means and into the pressure chamber means to thereby apply pressure against the pressure switch connected in the receptacle means; and wherein the adjustment means draws a vacuum on a vacuum switch in the receptacle means by forcing the fluid out of the pressure chamber means fluid housing means prior to connection of the vacuum switch and then drawing air from the pressure chamber means into the fluid housing means to thereby draw a vacuum on the vacuum switch in the receptacle means;

a DC power supply attached to the exterior of the adjustment housing means;

wires connecting to positive and negative ends of the power supply, the positive wire connecting to an indicator means and the negative wire connecting to one end of the switch being tested;

indicator means for indicating when the electrical connection changes in the switch and connecting to the positive wire of the power supply;

a wire connecting the indicator means to the other terminal of the switch being tested;

whereby when the switch changes operation, the current through the indicator changes and causes the indicator means to indicate the change in electrical connection; and measurement means for measuring the pressure and vacuum in the fluid housing means.

2. The tool of claim 1, further comprising a plug that cooperates with the receptacle means.

3. The tool of claim 1, wherein the fluid in the fluid storage means comprises a lubricating oil.

4. The tool of claim 1, wherein the adjustment means comprises a piston and a rod.

5. The tool of claim 4, wherein said piston comprises a push-pull piston.

6. A tool for testing pressure and vacuum switches comprising:

a housing;

a fluid chamber, comprising a fluid, within said housing and defined by said housing and a piston;

a piston rod attached to said piston and extending through said housing;

an adjustment housing chamber connected to the fluid chamber with a first passageway between the chambers to allow the piston rod to pass between the adjustment housing chamber and the fluid housing chamber and a second passageway that allows the rod to pass out of the adjustment housing chamber to a knob that allows the piston rod to function;

an adjusting knob operatively connected to the piston rod to rotate the piston rod and move the piston within the fluid chamber;

a return spring applying pressure against the piston rod and adjustment housing chamber to resist pressure application to enable the user applying pressure to modify the pressure more regularly;

a vent in the fluid chamber to allow air to assist in application of pressure against the fluid in the fluid chamber;

a pressure chamber, comprising a valve, in fluid communication with said fluid chamber;

a pressure/vacuum gauge connected to the pressure chamber that measures pressure and vacuum within the pressure chamber;

a receptacle for receiving a portion of the switch;

a DC power supply attached to the exterior of the adjustment housing means;

wires connecting to positive and negative ends of the power supply, the positive wire connecting to an indicator means and the negative wire connecting to one end of the switch being tested; and wherein the indicator means is connected to the switch and provides a visual indication of when the electrical connection changes within the switch and connecting to the positive wire of the power supply;

a wire connecting the indicator means to the other terminal of the switch being tested;

whereby when the switch changes operation, the current through the indicator means changes and causes the indicator means to indicate the change in electrical connection;

wherein the piston forces the fluid from the fluid chamber into the pressure chamber to increase the pressure on the pressure switch connected to the receptacle until the electrical connection in the pressure switch changes to thereby indicate the operation of the pressure switch; and wherein the piston draws air from the pressure chamber into the fluid chamber to draw a vacuum on a vacuum switch in the receptacle until the electrical connection in the vacuum switch changes to thereby indicate the operation of the vacuum switch at the vacuum being drawn in the pressure chamber.

7. The tool of claim 6 further comprising a testing, chamber comprising a pressure/vacuum gauge connected to said pressure chamber.

8. The tool of claim 6 further comprising clips connected to two or more wires, for attaching to terminals of said switch.

9. The tool of claim 6, wherein the fluid comprises a lubricating oil.

10. The tool of claim 6, wherein said piston is a push-pull piston.

11. A method for testing pressure and vacuum switches to determine the operating pressure or vacuum of the switch, the method comprising the steps of:

connecting the switch to a receptacle means connected to a pressure chamber, the pressure chamber being connected to a fluid chamber through a valve means, the fluid chamber housing a fluid and an adjustment means for adjusting the pressure and vacuum in the fluid chamber and pressure chamber when the valve is opened;

connecting an adjustment housing chamber to the fluid chamber with a first passageway between the chambers to allow a piston rod to pass between the adjustment housing chamber and the fluid housing chamber and a second passageway that allows the piston rod to pass out of the adjustment housing chamber to a knob that allows the piston rod to function;

providing a return spring applying pressure against the piston rod and adjustment housing chamber to resist pressure application to enable the user applying pressure to modify the pressure more regularly;

providing a vent in the fluid chamber to allow air to assist in application of pressure against the fluid in the fluid chamber;

connecting an indicator to the switch that indicates when the switch changes its electrical connection;

connecting a DC power supply that is attached to the exterior of the adjustment housing means to indicator and switch being tested;

applying a pressure or vacuum to the switch until the indicator operation by operating the adjustment means to change the pressure applied within the pressure chamber against the switch in the receptacle means; and measuring the pressure and vacuum in the fluid chamber to thereby determine the operating pressure of a pressure switch and the operating vacuum of a vacuum switch.

* * * * *